(12) United States Patent
Luo

(10) Patent No.: US 12,074,221 B2
(45) Date of Patent: Aug. 27, 2024

(54) ARRAY SUBSTRATE AND MANUFACTURING METHOD THEREOF, DISPLAY PANEL

(71) Applicant: Shenzhen China Star Optoelectronics Semiconductor Display Technology Co., Ltd., Guangdong (CN)

(72) Inventor: Chuanbao Luo, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 412 days.

(21) Appl. No.: 17/600,250

(22) PCT Filed: Jul. 29, 2021

(86) PCT No.: PCT/CN2021/109159
§ 371 (c)(1),
(2) Date: Sep. 30, 2021

(87) PCT Pub. No.: WO2023/004668
PCT Pub. Date: Feb. 2, 2023

(65) Prior Publication Data
US 2023/0024248 A1    Jan. 26, 2023

(30) Foreign Application Priority Data

Jul. 26, 2021 (CN) .......................... 202110841612.3

(51) Int. Cl.
*H01L 27/12* (2006.01)
*H01L 25/075* (2006.01)
(Continued)

(52) U.S. Cl.
CPC ...... *H01L 29/78633* (2013.01); *H01L 25/075* (2013.01); *H01L 27/1225* (2013.01);
(Continued)

(58) Field of Classification Search
CPC . H01L 25/075; H01L 25/0753; H01L 25/167; H01L 27/1225; H01L 27/12;
(Continued)

(56) References Cited

U.S. PATENT DOCUMENTS 8,395,153 B2 * 3/2013 Yamazaki ......... H01L 29/78606
257/43
11,024,747 B2 * 6/2021 Yamazaki ........... H01L 27/1225
(Continued)

FOREIGN PATENT DOCUMENTS

CN    104752477 A    7/2015
CN    105742367 A    7/2016
(Continued)

*Primary Examiner* — Nikolay K Yushin
(74) *Attorney, Agent, or Firm* — Rivka Friedman

(57) ABSTRACT

The present invention provides an array substrate and a display panel. The array substrate includes: an underlay; a source electrode and drain electrode disposed on underlay; a light shielding portion disposed on underlay; an active layer correspondingly disposed on the source electrode, the drain electrode, and the light shielding portion. The active layer includes a channel region, and the light shielding portion is disposed to correspond to the channel region. The present invention reduces processes and lowers cost by disposing the source electrode, the drain electrode, and the light shielding portion in a same layer such that the source electrode, the drain electrode, and the light shielding portion are simultaneously formed with a same material by a same process.

12 Claims, 9 Drawing Sheets

(51) Int. Cl.
*H01L 29/66* (2006.01)
*H01L 29/786* (2006.01)

(52) U.S. Cl.
CPC ...... *H01L 27/127* (2013.01); *H01L 29/66969* (2013.01); *H01L 29/7869* (2013.01)

(58) Field of Classification Search
CPC ............. H01L 27/127; H01L 29/78633; H01L 29/786; H01L 29/66969; H01L 29/66; H01L 29/7869; H01L 33/58; H01L 33/60; H01L 33/42; H01L 21/02554; H01L 21/02; H01L 21/768; H01L 21/82345; H01L 25/07; H01L 25/50; H01L 27/1288; H01L 27/0605; H01L 29/42384; H01L 29/423; H01L 29/4908; H01L 29/49; H01L 29/78636; H01L 33/0075; H01L 33/0093; H01L 33/62; H01L 33/06
See application file for complete search history.

(56) References Cited

U.S. PATENT DOCUMENTS

| | | | | |
|---|---|---|---|---|
| 11,302,822 | B2* | 4/2022 | Liu | ................... H01L 29/78633 |
| 2012/0168756 | A1* | 7/2012 | Ryu | ................... H01L 29/78633 |
| | | | | 257/66 |
| 2012/0319106 | A1* | 12/2012 | Yamazaki | ........... H01L 27/1214 |
| | | | | 257/E29.296 |
| 2020/0220029 | A1* | 7/2020 | Yamazaki | ........... H01L 29/7869 |
| 2021/0328071 | A1* | 10/2021 | Liu | ...................... H10K 59/126 |

FOREIGN PATENT DOCUMENTS

| | | |
|---|---|---|
| CN | 206618932 U | 11/2017 |
| CN | 108257977 A | 7/2018 |
| CN | 108538921 A | 9/2018 |
| CN | 108780758 A | 11/2018 |
| CN | 210805780 U | 6/2020 |
| CN | 111769123 A | 10/2020 |
| CN | 111969008 A | 11/2020 |
| CN | 112599536 A | 4/2021 |
| CN | 113437090 A | 9/2021 |
| JP | H08330591 A | 12/1996 |

* cited by examiner

ARRAY SUBSTRATE AND MANUFACTURING METHOD THEREOF, DISPLAY PANEL

FIELD OF INVENTION

The present invention relates to a field of display technologies, especially to an array substrate and a manufacturing method thereof and a display panel.

BACKGROUND OF INVENTION

Mini/micro light emitting diode (LED) display technologies have entered an accelerated development stage in past two years and can be used in small and medium-sized display device applications. Compared to organic light emitting diode (OLED) screens, mini/micro LED displays can show better performance in terms of cost, contrast, high brightness and thin and light appearance. In the mini/micro LED display technologies, thin film transistor (TFT) backplate technologies are key technologies, but the technologies have complicated processes and high cost, which disadvantages mass production of mini/micro LED display panels.

With reference to FIG. 1, a conventional array substrate usually disposes a light shielding portion 1 under an active layer 2 to shield external light emitted to the active layer 2. The active layer 2 and a gate electrode 3 are separated by a gate electrode insulation layer 4, and an interlayer dielectric layer 5 is usually deposited on the active layer 2 and the gate electrode 3 by a chemical vapor deposition (CVD) process. A source electrode/drain electrode 6 is manufactured on the interlayer dielectric layer 5, and the source electrode/drain electrode 6 is electrically connected to the active layer 2 through a via hole in the interlayer dielectric layer 5. Manufacturing processes of the conventional array substrate require multiple photomasks, for example, at least six photomask processes including a patterning process for the light shielding portion, a patterning process for the active layer, a patterning process for the gate electrode insulation layer, a patterning process for the gate electrode, a patterning process for the interlayer dielectric layer, and a patterning process for the source electrode/drain electrode, which makes the manufacturing processes of the array substrate complicated and have high costs.

SUMMARY OF INVENTION

Technical Issue

The present invention provides an array substrate and manufacturing method thereof, display panel that can solve a technical issue that a conventional TFT backplate manufacturing process is complicated and results in high costs.

Technical Solution

To solve the above issue, technical solutions provided by the present invention are as follows: The present invention embodiment provides an array substrate comprising:
  an underlay;
  a source electrode disposed on the underlay;
  a drain electrode disposed on the underlay;
  a light shielding portion disposed on the underlay; and
  an active layer disposed correspondingly on the source electrode, the drain electrode, and the light shielding portion, wherein the active layer comprises a channel region;
  wherein the light shielding portion corresponds to the channel region, the source electrode, the drain electrode, and the light shielding portion are disposed in a same layer, and a material of the source electrode and the drain electrode is same as a material of the light shielding portion.

Optionally, in some embodiments of the present invention, the active layer further comprises a non-channel region located on two sides of the channel region, and the source electrode and the drain electrode contact the non-channel region.

Optionally, in some embodiments of the present invention, the array substrate further comprises a top gate, the top gate is located on the active layer, and the top gate is disposed to correspond to the channel region of the active layer.

Optionally, in some embodiments of the present invention, the light shielding portion is disposed at an interval from the source electrode and is disposed at an interval from the drain electrode, and the light shielding portion is disposed opposite rightly to the top gate; or, the light shielding portion is connected to at least one of the source electrode and the drain electrode.

Optionally, in some embodiments of the present invention, the light shielding portion comprises a first portion connected to the source electrode and a second portion connected to the drain electrode, and the first portion and the second portion are spaced at an interval.

Optionally, in some embodiments of the present invention, an orthographic projection of the light shielding portion on the underlay covers an orthographic projection of a corresponding portion of the channel region of the active layer on the underlay.

Optionally, in some embodiments of the present invention, the top gate is electrically connected to the light shielding portion through a via hole.

Optionally, in some embodiments of the present invention, the array substrate further comprises:
  a buffer layer disposed between the light shielding portion and the active layer;
  a gate electrode insulation layer corresponding to the channel region and disposed between the active layer and the top gate; and
  a first passivation layer disposed on the top gate;
  wherein the top gate is electrically connected to the light shielding portion through a conductive layer disposed spaced at an interval from the active layer, the conductive layer comprises a first lead wire and a second lead wire; the first lead wire and the light shielding portion are disposed in a same layer and are electrically connected to each other; the second lead wire is located on the first passivation layer, an end of the second lead wire is electrically connected to the top gate through a first via hole extending through the first passivation layer, and another end of the second lead wire is electrically connected to the first lead wire through a second via hole extending through the first passivation layer and the buffer layer.

Optionally, in some embodiments of the present invention, the top gate and/or the light shielding portion, the source electrode, the drain electrode, and the active layer constitute a thin film transistor, the array substrate comprises a driver thin film transistor and a switch thin film transistor, wherein the driver thin film transistor and the switch thin film transistor are top gate structures; or, the driver thin film transistor and the switch thin film transistor are bottom gate structures; or, the driver thin film transistor and the switch thin film transistor are dual gate structures; or, the driver thin film transistor is a dual gate structure, and the switch thin film transistor is a top gate or a bottom gate structure.

The present invention embodiment also provides a display panel comprising an array substrate and a light emitting diode (LED), wherein the array substrate comprises:
- an underlay;
- a source electrode disposed on the underlay;
- a drain electrode disposed on the underlay;
- a light shielding portion disposed on the underlay; and
- an active layer disposed correspondingly on the source electrode, the drain electrode, and the light shielding portion, wherein the active layer comprises a channel region;
- wherein the light shielding portion corresponds to the channel region, the source electrode, the drain electrode, and the light shielding portion are disposed in a same layer, and a material of the source electrode and the drain electrode is same as a material of the light shielding portion.

Optionally, in some embodiments of the present invention, the active layer further comprises a non-channel region located on two sides of the channel region, and the source electrode and the drain electrode contact the non-channel region.

Optionally, in some embodiments of the present invention, the array substrate further comprises top gate, the top gate is located on the active layer, and the top gate is disposed to correspond to the channel region of the active layer.

Optionally, in some embodiments of the present invention, the light shielding portion is disposed at an interval from the source electrode and is disposed at an interval from the drain electrode, and the light shielding portion is disposed opposite rightly to the top gate; or, the light shielding portion is connected to at least one of the source electrode and the drain electrode.

Optionally, in some embodiments of the present invention, the light shielding portion comprises a first portion connected to the source electrode and a second portion connected to the drain electrode, and the first portion and the second portion are spaced at an interval.

Optionally, in some embodiments of the present invention, an orthographic projection of the light shielding portion on the underlay covers an orthographic projection of a corresponding portion of the channel region of the active layer on the underlay.

Optionally, in some embodiments of the present invention, the top gate is electrically connected to the light shielding portion through a via hole.

Optionally, in some embodiments of the present invention, the array substrate further comprises:
- a buffer layer disposed between the light shielding portion and the active layer;
- a gate electrode insulation layer corresponding to the channel region and disposed between the active layer and the top gate; and
- a first passivation layer disposed on the top gate;
- wherein the top gate is electrically connected to the light shielding portion through a conductive layer disposed at an interval from the active layer, the conductive layer comprises a first lead wire and a second lead wire; the first lead wire and the light shielding portion are disposed in a same layer and are electrically connected to each other; the second lead wire is located on the first passivation layer, an end of the second lead wire is electrically connected to the top gate through a first via hole extending through the first passivation layer, and another end of the second lead wire is electrically connected to the first lead wire through a second via hole extending through the first passivation layer and the buffer layer.

Optionally, in some embodiments of the present invention, the top gate and/or the light shielding portion, the source electrode, the drain electrode, and the active layer constitute a thin film transistor, the array substrate comprises a driver thin film transistor and a switch thin film transistor, wherein the driver thin film transistor and the switch thin film transistor are top gate structures; or, the driver thin film transistor and the switch thin film transistor are bottom gate structures; or, the driver thin film transistor and the switch thin film transistor are dual gate structures; or, the driver thin film transistor is a dual gate structure, and the switch thin film transistor is a top gate or a bottom gate structure.

The present invention embodiment also provides an array substrate manufacturing method, the manufacturing method comprises steps as follows:
- a step S11 forming a first metal layer on an underlay, and patterning the first metal layer to form a light shielding portion, a source electrode, and a drain electrode;
- a step S12, forming a buffer layer on the first metal layer, and patterning the buffer layer to form source and drain electrode contact holes defined through the buffer layer and corresponding to the source electrode and the drain electrode; and
- a step S13 forming an active layer on the buffer layer, and forming a channel region of the active layer and a non-channel region on two sides of the channel region;
- wherein the non-channel region of the active layer is connected to the source electrode and the drain electrode through the source and drain electrode contact holes, and the light shielding portion corresponds to the channel region.

Optionally, in some embodiments of the present invention, the manufacturing method further comprises a step as follow:
- a step S14 forming a gate electrode insulation layer and a top gate laminated on the active layer, wherein the gate electrode insulation layer and the top gate corresponds to the channel region located in the active layer.

Advantages

Advantages of the present invention is as follows: The array substrate, the manufacturing method thereof, and the display panel provided by the present invention, dispose a source electrode, a drain electrode, and a light shielding portion in a same layer, and the source electrode and the drain electrode use the same material as that of the light shielding portion such that during manufacturing the array substrate, the source electrode, the drain electrode, and the light shielding portion can be simultaneously formed by the same process. Compared to the conventional structure employing two photomask processes for forming the light shielding portion and source and the drain electrode respectively, the present invention can reduce processes and lower costs.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
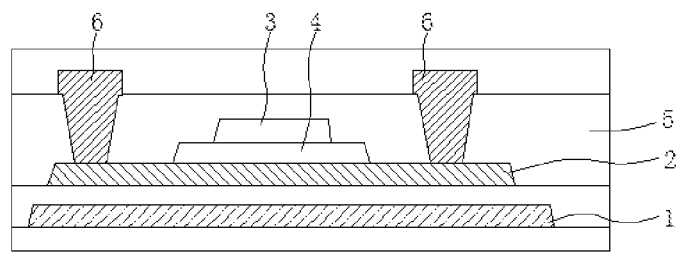
FIG. 1 is a schematic structural view of a conventional array substrate.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

To solve a technical issue that a conventional array substrate has complicated processes and high cost, the present invention embodiment provides an array substrate and a display panel. With reference to FIGS. 2 to 17, the array substrate of the present invention comprises: an underlay 101; a source electrode 102 disposed on the underlay 101; a drain electrode 103 disposed on the underlay 101; a light shielding portion 104 disposed on the underlay 101; an active layer 106 disposed correspondingly on the source electrode 102, the drain electrode 103, and the light shielding portion 104, wherein the active layer 106 comprises a channel region 1061. The light shielding portion 104 is disposed to correspond to the channel region 1061. The source electrode 102, the drain electrode 103, and the light shielding portion 104 are disposed in a same layer, and a material of the source electrode 102 and the drain electrode 103 is same as a material of the light shielding portion 104.

It can be understood that, description "disposed in a same layer" here can be that the source electrode 102, the drain electrode 103, and the light shielding portion 104 are disposed at intervals in a same layer, and can be that the light shielding portion 104 is connected to one of the source electrode 102 and the drain electrode 103 and the three are disposed in a same layer.

The present invention simultaneously forms the source electrode 102, the drain electrode 103, and the light shielding portion 104 by using a same material and a same photomask process, and can omit one photomask process for individually manufacturing the source and the drain electrode compared to a conventional array substrate such that cost can be lowered and processes can be reduced.

Furthermore, the active layer 106 comprises a channel region 1061 and a non-channel region 1062 located on two sides of the channel region 1061, and the source electrode 102 and the drain electrode 103 contact the non-channel region 1062 respectively. Because the source electrode 102 and the drain electrode 103 of the present invention are disposed in a same layer with the light shielding portion 104, and a bottom portion of the active layer 106 contacts top portions of the source electrode 102 and the drain electrode 103, a manufacturing process for an interlayer dielectric layer is omitted. In FIG. 1, the interlayer dielectric layer 5 is usually manufactured by a chemical vapor deposition (CVD) process, and a process temperature would negatively affect the active layer 2 and the gate electrode 3. Especially, when the active layer 2 is an oxide semiconductor material, a high temperature of the CVD process would affect crystallization capability of the oxide semiconductor. The present invention requires no interlayer dielectric layer, and therefore facilitates improvement of temperature stability of a device.

The array substrate of the present invention can be an array substrate with a bottom gate structure, can be an array substrate with a top gate structure, can also be an array substrate with a dual gate structure (i.e., a bottom gate and a top gate are included), or can also be a combination of any of the three structures.

With specific reference to an embodiment as follows, it should be explained that an order of descriptions in following embodiments is not to limit the preferred order of the embodiments.

First Embodiment

Figure 2:
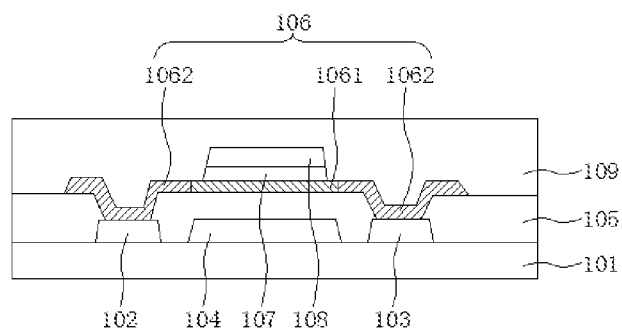
FIGS. 2 to 4 are schematic structural views of an array substrate of a top gate structure provided by a first embodiment of the present invention.
Figure 3:
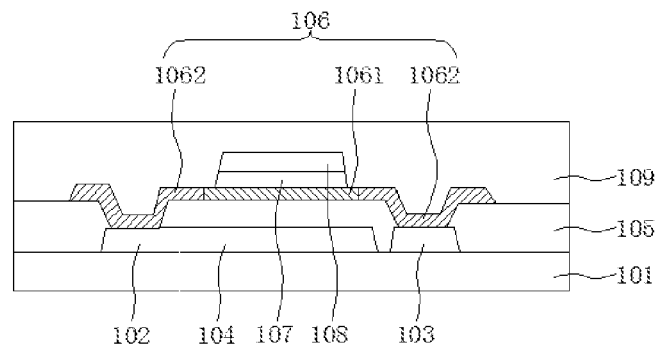
Figure 4:
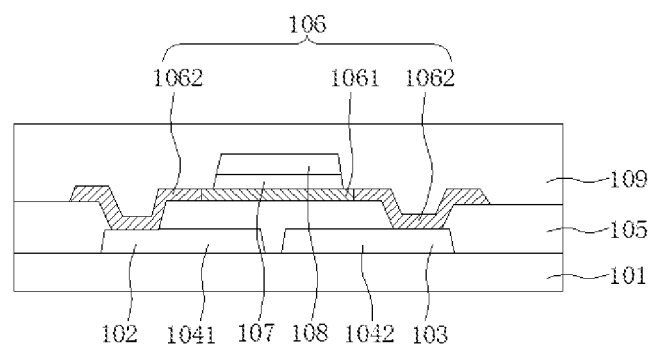

With reference to FIGS. 2 to 4, the present embodiment takes an array substrate of a top gate structure as an example for explanation. The array substrate comprises: an underlay 101, wherein the underlay 101 can be a glass underlay, or can also be a flexible underlay; a source electrode 102, a drain electrode 103, and a light shielding portion 104 disposed on the underlay 101 in a same layer; a buffer layer 105 disposed on the source electrode 102, the drain electrode 103, and the light shielding portion 104; an active layer 106 disposed on the buffer layer 105, wherein the active layer comprises a channel region 1061 and a non-channel region 1062 located on two sides of the channel region 1061, and the source electrode 102 and the drain electrode 103 contact the non-channel region 1062 of the active layer 106 through via holes in the buffer layer 105 respectively; a gate electrode insulation layer 107 corresponding to the channel region 1061 and disposed on the active layer 106; a top gate 108 corresponding to the channel region 1061 and disposed on the gate electrode insulation layer 107; and a first passivation layer 109 disposed on the active layer 106 and the top gate 108.

The light shielding portion 104 is located under the active layer 106 and is configured to shield external light emitted from the underlay 101 to the channel region 1061 of the active layer 106. Furthermore, an orthographic projection of the light shielding portion 104 on the underlay 101 covers an orthographic projection of a corresponding portion of the channel region 1061 of the active layer 106 on the underlay 101. With reference to FIG. 2, the light shielding portion 104 is disposed at an interval from the source electrode 102 and is disposed at an interval from the drain electrode 103. The light shielding portion 104 is located between the source electrode 102 and the drain electrode 103, and the three are made of a same material. Therefore, the light shielding portion 104, the source electrode 102, and the drain electrode 103 cooperatively shield the external light emitted from the underlay 101 to the active layer 106.

With reference to FIG. 3, the light shielding portion 104 is connected to the source electrode 102, namely, the light shielding portion 104 and the source electrode 102 commonly share a same film layer. In other words, a portion of the source electrode 102 can extend toward a side of the channel region 1061 as the light shielding portion 104 such that the source electrode 102 and the light shielding portion 104 can commonly share a same film layer. A size and a shape of the light shielding portion 104 can be set according to actual demands to shield the active layer 106 as much as possible.

Of course, in other embodiment, the light shielding portion 104 can be connected to the drain electrode 103, and a connection way is similar to a connection way of the above light shielding portion 104 connected to the source electrode 102 and is not described repeatedly here.

With reference to FIG. 4, the light shielding portion (1041, 1042) comprises a first portion 1041 connected to the source electrode 102, and comprises a second portion 1042 connected to the drain electrode 103. The first portion 1041 and the second portion 1042 are spaced at an interval. In other words, a portion of the source electrode 102 extends toward the channel region 1061 as the first portion 1041 of the light shielding portion, a portion of the drain electrode 103 extends toward a side of the channel region 1061 as the second portion 1042 of the light shielding portion. In other words, the light shielding portion (1041, 1042) can be shared with the source electrode 102 and the drain electrode 103. At this time, the light shielding portion (1041, 1042), the source electrode 102, and the drain electrode 103 commonly shield the external light emitted from the underlay 101 to the active layer 106.

The top gate 108, the source electrode 102, the drain electrode 103, and the active layer 106 constitute a thin film transistor, the thin film transistor can be a driver thin film transistor or a switch thin film transistor. The array substrate of the present embodiment can comprise a driver thin film transistor and a switch thin film transistor. Both the driver thin film transistor and the switch thin film transistor are top gate structures.

Compared to the conventional array substrate, the present embodiment can omit a photomask process individually for manufacturing the source and drain electrode, and omit a process individually for manufacturing the interlayer dielectric layer such that processes can be reduced to lower cost.

Second Embodiment

Figure 5:
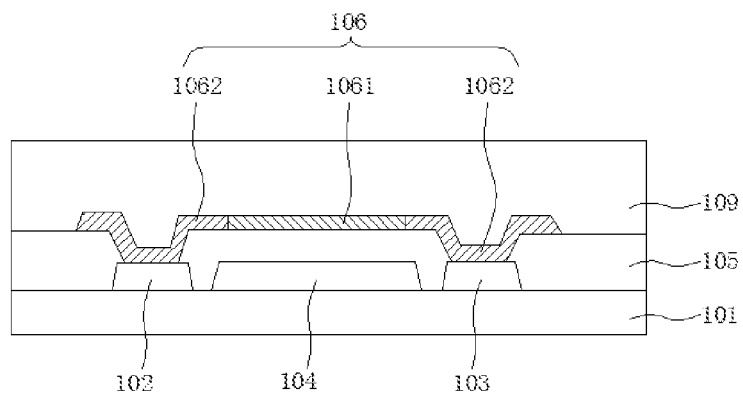
FIG. 5 is a schematic structural view of an array substrate of a bottom gate structure provided by a second embodiment of the present invention.

With reference to FIG. 5, the present embodiment takes an array substrate of a bottom gate structure as an example for explanation. The array substrate comprises: an underlay 101; a source electrode 102, a drain electrode 103, and light shielding portion 104 disposed on the underlay 101 in a same layer, wherein the light shielding portion 104 is located between the source electrode 102 and the drain electrode 103, a material of the light shielding portion 104 and the source electrode 102 is same as a material of the drain electrode 103, and are all conductive and light shielding materials; a buffer layer 105 disposed on the source electrode 102, the drain electrode 103, and the light shielding portion 104; an active layer 106 disposed on the buffer layer 105, wherein the active layer comprises a channel region 1061 and a non-channel region 1062 located on two sides of the channel region 1061, the source electrode 102 and the drain electrode 103 contact the non-channel region 1062 of the active layer 106 through via holes in the buffer layer 105 respectively, and the light shielding portion 104 right faces the channel region 1061; and a first passivation layer 109 disposed on the active layer 106.

The light shielding portion 104 is disposed at an interval from the source electrode 102 and is disposed at an interval from the drain electrode 103. An orthographic projection of the light shielding portion 104 on the underlay 101 covers an orthographic projection of a corresponding portion of the channel region 1061 of the active layer 106 on the underlay 101. The light shielding portion 104 can serve as a bottom gate of the thin film transistor, namely, the light shielding portion 104 can be shared with the bottom gate. Because the light shielding portion 104, the source electrode 102, and the drain electrode 103 have the same material, the light shielding portion (bottom gate) 104, the source electrode 102, and the drain electrode 103 can commonly shield external light emitted from the underlay 101 to the active layer 106.

The light shielding portion (bottom gate) 104, the source electrode 102, the drain electrode 103, and the active layer 106 constitute the thin film transistor, and the thin film transistor is a switch thin film transistor or a driver thin film transistor. The array substrate of the present embodiment can comprise the driver thin film transistor and the switch thin film transistor. Both the driver thin film transistor and the switch thin film transistor are bottom gate structures.

In the present embodiment, because the light shielding portion (bottom gate) 104, the source electrode 102, and the drain electrode 103 are simultaneously formed by the same material, processes can be simplified and cost can be lowered.

Third Embodiment

Figure 6:
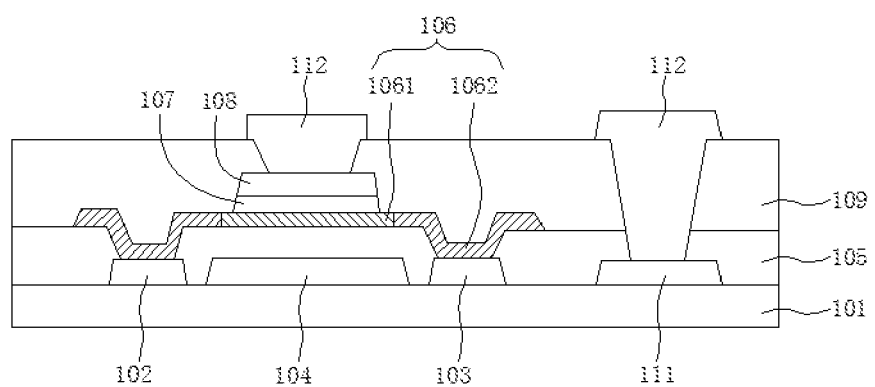
FIG. 6 is a schematic structural view of an array substrate of a dual gate structure provided by a third embodiment of the present invention.
Figure 7:
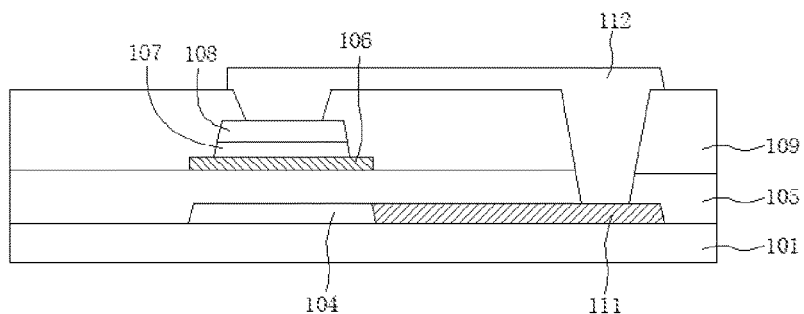
FIG. 7 is a cross-sectional view along a wiring direction of a conductive layer of the array substrate provided by the third embodiment of the present invention.

With reference to FIGS. 6 and 7, the present embodiment takes an array substrate of a dual gate structure as an example for explanation. A difference of the present embodiment from the above second embodiment is as follows:

The array substrate of the present embodiment further comprises: a gate electrode insulation layer 107 corresponding to a channel region 1061 and disposed on an active layer 106; and a top gate 108 corresponding to the channel region 1061 and disposed on the gate electrode insulation layer 107. The first passivation layer 109 of the present embodiment is disposed on the active layer 106 and the top gate 108. The top gate 108 is electrically connected to the light shielding portion 104 through a via hole. Specifically with reference to FIG. 7, the top gate 108 is electrically connected to the light shielding portion 104 through a conductive layer, and the conductive layer comprises a first lead wire 111 and a second lead wire 112. The first lead wire 111 and the light shielding portion 104 are disposed in a same layer and are electrically connected to each other. The second lead wire 112 is located above the first passivation layer 109. An end of the second lead wire 112 is electrically connected to the top gate 108 through a first via hole extending through the first passivation layer 109. Another end of the second lead wire 112 is electrically connected to the first lead wire 111 through a second via hole extending through the first passivation layer 109 and the buffer layer 105.

Optionally, the first lead wire 111 can use a material the same as a material of the light shielding portion 104, the source electrode 102, and the drain electrode 103, and can be simultaneously formed in a same process.

Optionally, the light shielding portion 104 and the first lead wire 111 can be formed integrally.

The light shielding portion 104, the source electrode 102, the drain electrode 103, the active layer 106, and the top gate 108 constitute a dual gate thin film transistor, and the dual gate thin film transistor is a switch thin film transistor or a driver thin film transistor. The array substrate of the present embodiment can comprise the driver thin film transistor and the switch thin film transistor. The driver thin film transistor and the switch thin film transistor are dual gate structures.

Other structures of the array substrate of the present embodiment are same as/similar to the structures of the array substrate of the above second embodiment, and will not be described repeatedly here.

In the present embodiment, because the thin film transistor is the dual gate structure, compared to the thin film transistors of a single gate structure of the first and second embodiments, current driving capability of the thin film transistor of the present embodiment is improved drastically. On one hand, it is because a width of an effective channel of the dual gate thin film transistor is greater. On another hand, because carriers in the dual gate thin film transistor suffer smaller interface scattering, mobility of the carriers is greater.

Fourth Embodiment

With reference to FIGS. 2 to 6, the array substrate of the present embodiment comprises a driver thin film transistor and a switch thin film transistor, the driver thin film transistor is a dual gate structure and is configured to provide a greater driving current. The switch thin film transistor is a top gate or bottom gate structure. The thin film transistor of the dual gate structure can refer to the descriptions of the above third embodiment. The thin film transistor of the top gate structure can refer to the descriptions of the above first embodiment. The thin film transistor of the bottom gate structure can refer to the descriptions of the above second embodiment, and will not be described repeatedly here. Optionally, a material of the active layer 106 of the driver thin film transistor and/or a material of the active layer 106 of the switch thin film transistor is one of indium gallium zinc oxide, indium gallium zinc tin oxide, and indium gallium tin oxide.

Optionally, the driver thin film transistor is a metal oxide thin film transistor, the switch thin film transistor is a low-temperature polycrystalline silicon thin film transistor.

In the conventional mini/micro LED display technology, current required by an LED chip is higher, and total current of the display panel is generally 3A to 8A. Accordingly, voltage on the metal wires is also higher, which causes voltage power consumption of the metal wires of the display panel to increase. Also, to fulfill large current required by the LED chip in the conventional technology, VDD/VSS metal wire usually employs a design of dual layer metal wires. On one hand, the dual layer metal wires increase a number of photomasks for the array substrate, and on another hand, an increasing number of the metal wire layers raises a risk of a short circuit.

In the present embodiment, in one aspect, the active layer using the above metal oxide material can have a higher mobility to be able to lower the voltage power consumption of the metal wires. In another aspect, the driver thin film transistor employs a dual gate structure and can provide the LED chip with large current. Therefore, the VDD/VSS metal wires of the present embodiment can only adopt a design of single layer metal wires, which can further reduce the number of the photomasks to prevent the risk of the short circuit.

Fifth Embodiment

The present invention also provides a display panel, the display panel comprises the array substrate and the LED diode as above. The LED diode is a mini LED or a micro LED. Here, only the array substrate comprising the driver thin film transistor of the dual gate structure and the switch thin film transistor of the top gate structure is taken as an example for explanation.

Figure 8:
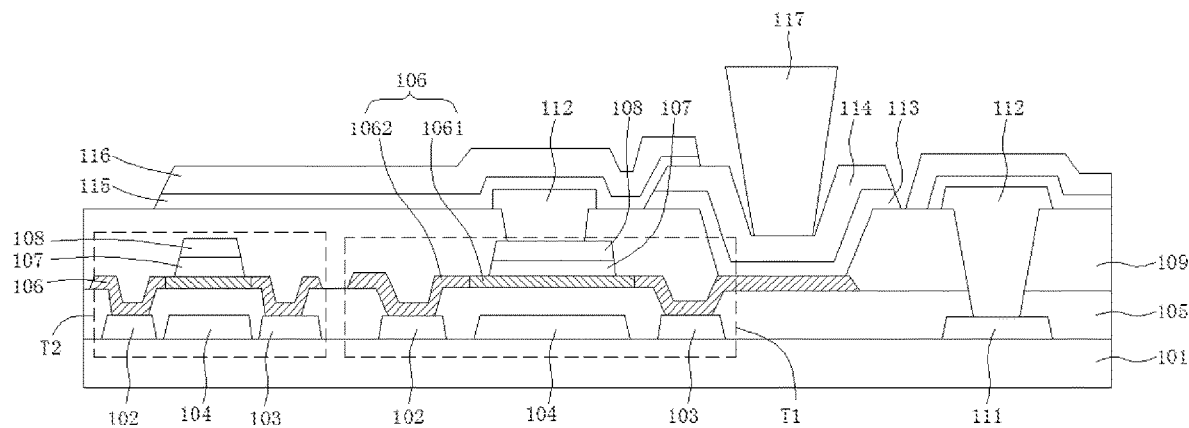
FIG. 8 is a schematic structural view of a display panel of a fifth embodiment of the present invention.

With reference to FIG. 8 specifically, the display panel comprises: an underlay 101; a source electrode 102, a drain electrode 103, and a light shielding portion 104 disposed on the underlay 101 in a same player, wherein the light shielding portion 104 is located between the source electrode 102 and the drain electrode 103 of a driver thin film transistor T1; a buffer layer 105 disposed on the source electrode 102, drain electrode 103, and light shielding portion 104; an active layer 106 disposed on the buffer layer 105 at intervals, wherein the active layer 106 comprises a channel region 1061 and a non-channel region 1062 located on two sides of the channel region 1061, the source electrode 102 and the drain electrode 103 contact the non-channel region 1062 of the active layer 106 through via holes of the buffer layer 105 respectively; a gate electrode insulation layer 107 corresponding to the channel region 1061 and disposed on the active layer 106; a top gate 108 corresponding to the channel region 1061 and disposed on the gate electrode insulation layer 107; and a first passivation layer 109 disposed on the active layer 106 and the top gate 108.

The top gate 108 and the light shielding portion 104 of the driver thin film transistor T1 are electrically connected to each other through a via hole. With specific reference to FIG. 7, the top gate 108 and the light shielding portion 104 are electrically connected to each other through a conductive layer, and the conductive layer comprises a first lead wire 111 and a second lead wire 112. The first lead wire 111 and the light shielding portion 104 are disposed in a same layer and are electrically connected to each other. The second lead wire 112 is located on the first passivation layer 109, an end of the second lead wire 112 is electrically connected to the top gate 108 through a first via hole extending through the first passivation layer 109, and another end of the second lead wire 112 is electrically connected to the first lead wire 111 through a second via hole extending through the first passivation layer 109 and the buffer layer 105. The light shielding portion 104 of the driver thin film transistor T1 can also serve as a bottom gate to control an electron channel in a lower surface of the active layer 106. The top gate 108 controls an electron channel in an upper surface of the active layer 106. The light shielding portion 104 and the top gate 108 are bridged to commonly control switching on and off of the driver thin film transistor T1.

The display panel further comprises: an electrode layer 113 corresponding to a pixel aperture region and disposed on the first passivation layer 109, wherein the electrode layer 113 contacts the non-channel region 1062 of the active layer 106 of the driver thin film transistor T1 through a third via hole extending through the first passivation layer 109; a soldering pad 114 corresponding to the electrode layer 113 and disposed on the electrode layer 113; a second passivation layer 115 disposed on the second lead wire 112; a black matrix 116 disposed on the second passivation layer 115, wherein the black matrix 116 and the second passivation layer 115 expose the soldering pad 114 and the electrode layer 113 in the pixel aperture region; an LED diode 117 is disposed in the pixel aperture region and is bonded to the electrode layer 113 through the soldering pad 114.

The LED diode 117 comprises a red LED diode, a green LED diode, and a blue LED diode.

A design of the black matrix 116 can lower an influence of the thin film transistor to diffusion light of the LED.

In the present embodiment, the light shielding portion 104, the source electrode 102, and the drain electrode 103 has a same material that is conductive and light-shielding.

In the present embodiment, a design of the light shielding portion of the driver thin film transistor T1 is same as or similar to a design of the light shielding portion in the above second embodiment. Namely, the light shielding portion 104 can be disposed at an interval from the source electrode 102 and at an interval from the drain electrode 103. The light shielding portion 104, source electrode 102, and drain electrode 103 can commonly shield external light emitted from the underlay 101 to the active layer 106. Alternatively, the light shielding portion 104 is connected to at least one of the source electrode 102 and the drain electrode 103. At least one of the source electrode 102 and the drain electrode 103 serves as a light shielding portion. Please specifically refer to the above second embodiment and FIG. 6, which will not be described repeated here.

In the present embodiment, a design of the light shielding portion 104 corresponding to a switch thin film transistor T2 is same as or similar to a design of the light shielding portion 104 in the above first embodiment. Namely, the light shielding portion 104 is disposed at an interval from the source electrode 102 and at an interval from the drain electrode 103, and the light shielding portion 104, the source electrode 102, and the drain electrode 103 commonly shield the external light emitted from the underlay 101 to the active layer 106. Alternatively, the light shielding portion 104 is connected to at least one of the source electrode 102 and the drain electrode 103. At least one of the source electrode 102 and the drain electrode 103 serves as a light shielding portion. Please specifically refer to the above first embodiment and FIGS. 2 to 4, which will not be described repeated here.

In the present embodiment, because the source electrode 102, the drain electrode 103, and the light shielding portion 104 are in a same layer with a same material, and are formed by a same process, the present embodiment can omit two photomasks for individually manufacturing the source and drain electrode and the bottom gate compared to the conventional array substrate, and can further reduce processes and lower cost. In the meantime, the present embodiment requires no interlayer dielectric layer of a CVD process. Therefore, light irradiation of a device and stability of the temperature are improved drastically. Moreover, the driver thin film transistor of the present embodiment utilizes a dual gate structure, which can supply the LED diode with large current. Therefore, VDD/VSS metal wires of the display panel of the present embodiment only need to employ metal wires of a single layer, which can decrease a number of the photomasks to prevent a risk of a short circuit.

With reference to FIGS. 9 to 17, the present invention also provides a display panel manufacturing method, the display panel manufacturing method comprises an array substrate manufacturing method, wherein the array substrate manufacturing method comprises steps as follows:

A step S11 comprises forming a first metal layer on an underlay 101, and patterning the first metal layer to form a light shielding portion 104, a source electrode 102, and a drain electrode 103.

A material of the first metal layer is a light-shielding conductive material.

A step S12 comprises forming on a buffer layer 105 on the first metal layer, and patterning the buffer layer 105 to form a source and drain electrode contact hole 118 extending through the buffer layer 105 and corresponding to the source electrode 102 and the drain electrode 103.

A step S13 comprises forming an active layer 106 on the buffer layer 105, and forming a channel region 1061 of the active layer 106 and a non-channel region 1062 located on two sides of the channel region 1061.

The non-channel region 1062 of the active layer 106 is connected to the source electrode 102 and the drain electrode 103 through the source and drain electrode contact hole 118, and the light shielding portion 104 corresponds to the channel region 1061.

In the present embodiment, the light shielding portion 104 can prevent external light from being emitted from a rear of the underlay 101 to the channel region 1061 of the active layer 106, and the light shielding portion 104 can also serve as a bottom gate. Namely, the light shielding portion 104, the source electrode 102, the drain electrode 103, and the active layer 106 form a thin film transistor of the bottom gate structure. The light shielding portion (bottom gate) 104, the source electrode 102, and drain electrode 103 are formed simultaneously to solve a technical issue that a conventional light shielding layer and a source and drain electrode are formed by different processes and result in complicated processes and high cost.

Of course, the light shielding portion 104 can only be used for light shielding. In an embodiment, the manufacturing method further comprises step as follows:

A step S14 comprises forming a gate electrode insulation layer 107 and a top gate 108 laminated on the active layer 106. The gate electrode insulation layer 107 and the top gate 108 are correspondingly located in the channel region 1061 of the active layer 106.

In the present embodiment, the light shielding portion 104 can prevent external light from being emitted from the rear of the underlay 101 to the channel region 1061 of the active layer 106. The source electrode 102, the drain electrode 103, the active layer 106, and the top gate 108 form a thin film transistor of the top gate structure.

Figure 9:
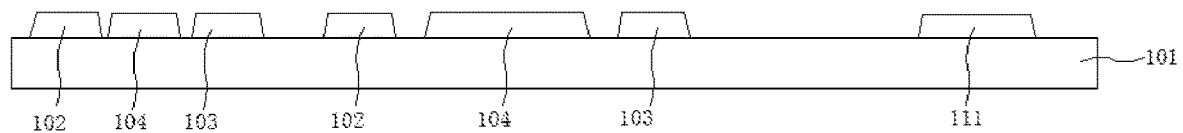
FIGS. 9 to 17 are schematic manufacturing flowcharts of the display panel provided by the fifth embodiment of the present invention.

In an embodiment, the array substrate manufacturing method comprises steps as follows:

A step S1, as shown in FIG. 9, comprises forming a first metal layer on an underlay 101, and patterning the first metal layer to form a light shielding portion 104, a source electrode 102, a drain electrode 103, and a first lead wire 111.

The underlay 101 can be a glass substrate, but is not limited to be a glass substrate. The first metal layer can be Mo, a lamination layer of Mo/Cu, or a lamination layer of MoTi/Cu, and a thickness of the first metal layer is 5000 Å-8000 Å. A method for manufacturing the first metal layer can be a physical vapor deposition process, and can use $H_2O_2$ series liquid medicine as an etchant to etch the first metal layer.

Figure 10:
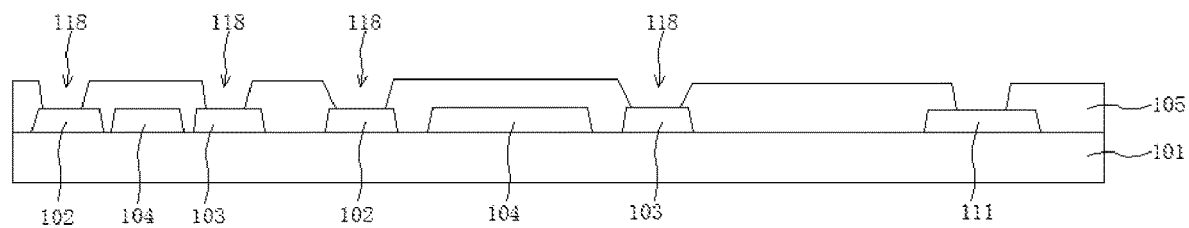

A step S2, as shown in FIG. 10, comprises forming a buffer layer 105 on the first metal layer, and patterning the buffer layer 105 to form a source and drain electrode contact hole 118 extending through the buffer layer 105.

A material of the buffer layer 105 can be $SiO_x$ or a lamination layer of $SiN_x/SiO_x$, and employs a chemical vapor deposition process, and is processed by a high temperature annealing process for 2-3 hours at a temperature of 300° C.-400° C., and then is patterned to form a source and drain electrode contact hole.

Figure 11:
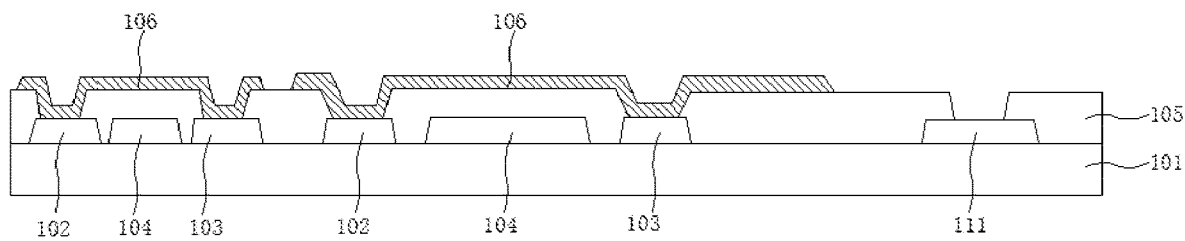

A step S3, as shown in FIG. 11, comprises forming an active layer 106 on the buffer layer 105.

A material of the active layer 106 is one of indium gallium zinc oxide, indium gallium zinc tin oxide, and indium gallium tin oxide.

Figure 12:
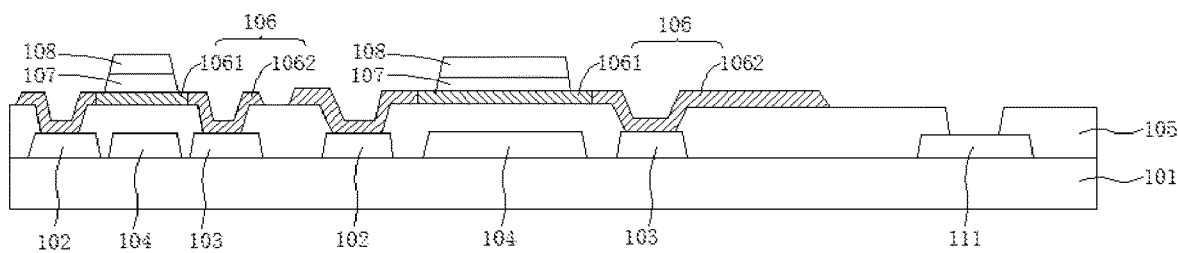

A step S4, as shown in FIG. 12, comprises forming a gate electrode insulation layer 107 and a top gate 108 laminated on the active layer 106. The gate electrode insulation layer 107 and the top gate 108 are disposed to correspond to the channel region 1061 of the active layer 106.

Specifically, a gate electrode insulation layer and a second metal layer are sequentially deposited on the active layer 106, the second metal layer is patterned to formed a top gate 108, and the gate electrode insulation layer 107 is patterned by a top gate self-alignment process, and then the active layer 106 is processed by plasma to form a channel region 1061 and a non-channel region 1062 of the thin film transistor. The non-channel region 1062 is electrically connected to the source electrode 102 and the drain electrode 103 through the source and drain electrode contact hole 118.

A material of the gate electrode insulation layer 107 can be $SiO_x$, a lamination layer of $SiO_x$ and $SiN_x$, or a lamination layer of $SiO_x$, $SiN_x$, and $Al_2O_3$, and a thickness of the gate electrode insulation layer 107 is 2000 Å-5000 Å. A material of the top gate 108 can be Mo, a lamination layer of Mo/Cu, or a lamination layer of MoTi/Cu, and thickness of the top gate 108 is 5000 Å-8000 Å.

In the present embodiment, the light shielding portion 104 not only has a light shielding function, but also can serve as a bottom gate. The light shielding portion 104, the source electrode 102, the drain electrode 103, the active layer 106, and the top gate 108 form the thin film transistor of the dual gate structure.

Figure 13:
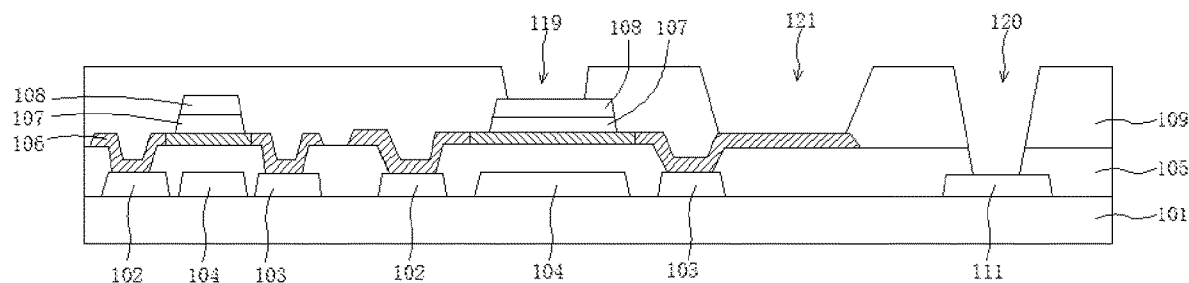

Furthermore, the display panel manufacturing method further comprises steps as follows:

A step S5, as shown in FIG. 13, comprises forming a first passivation layer 109 on the top gate 108, and patterning the first passivation layer 109 to form a first via hole 119 corresponding to the top gate 108, a second via hole 120 corresponding to the first lead wire 111, and a third via hole 121 corresponding to the pixel aperture region.

A material of the first passivation layer 109 can be $SiO_x$ or a lamination layer of $SiO_x/SiN_x$.

Figure 14:
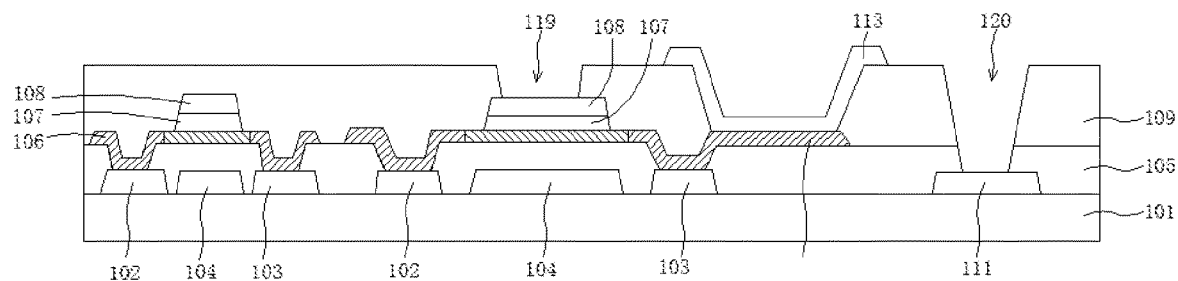

A step S6, as shown in FIG. 14, comprises forming an electrode layer 113 on the first passivation layer 109. The electrode layer 113 corresponds to the pixel aperture region and contacts the non-channel region 1062 of the active layer 106 through the third via hole.

Figure 15:
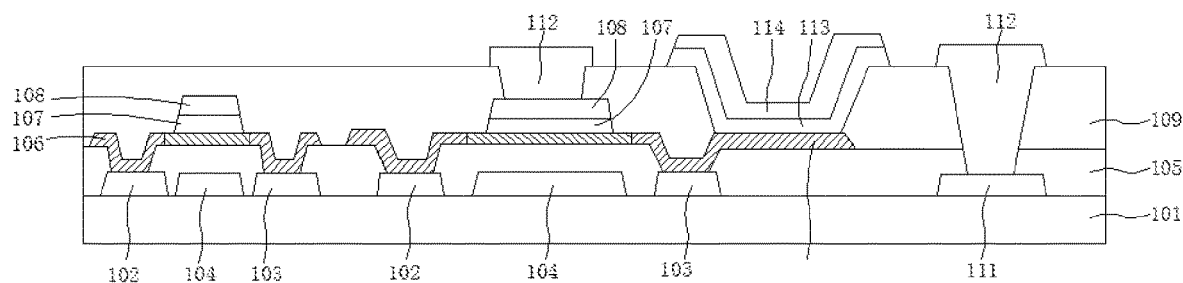

A step S7, as shown in FIG. 15, comprises forming a soldering pad 114 on the electrode layer 113, and simultaneously forming a second lead wire 112 on the first passivation layer 109, wherein an end of the second lead wire 112 is electrically connected to the top gate 108 through the first via hole, and another end of the second lead wire 112 is electrically connected to the first lead wire 111 through the second via hole.

The soldering pad 114 and the second lead wire 112 employ a same material and are simultaneously formed in a same process, and the same material can be an electrode including Cu, or Cu/Mo.

Figure 16:
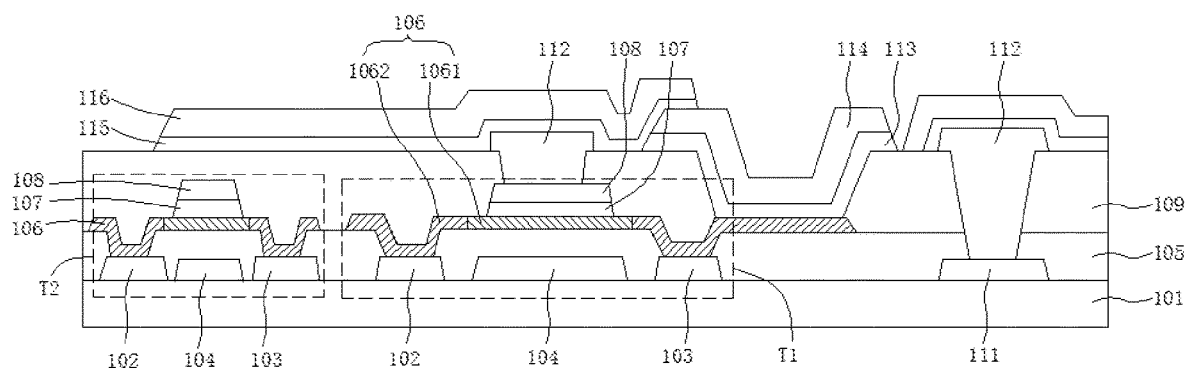

A step S8, as shown in FIG. 16, comprises forming a second passivation layer 115 and a black matrix 116 laminated on first passivation layer 109, wherein the black matrix 116 and the second passivation layer 115 expose the soldering pad 114 and the electrode layer 113 in the pixel aperture region.

During patterning the second passivation layer 115 and the black matrix 116, the patterned black matrix 116 serves as a photomask to complete patterning the second passivation layer 115.

Figure 17:
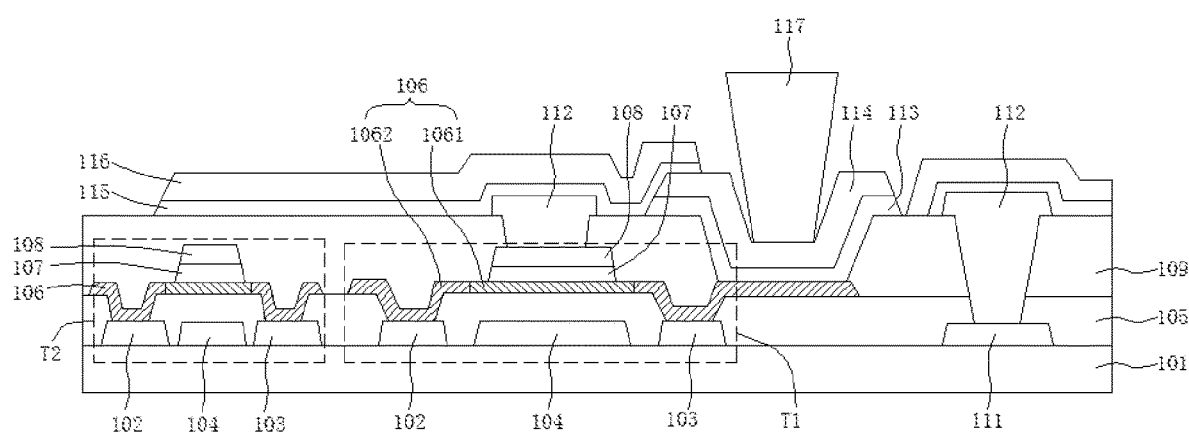

A step S9, as shown in FIG. 17, comprises bonding the LED diode 117 to the soldering pad 114.

In the present embodiment, because the source electrode 102, the drain electrode 103, a bottom gate 110, and the light shielding portion 104 are in a same layer with a same material, and are formed by a same process, the present embodiment can omit two photomasks for individually manufacturing the source and drain electrode and the bottom gate compared to the conventional array substrate and can further reduce processes and lower cost. In the meantime, the present embodiment requires no interlayer dielectric layer of a CVD process. Therefore, light irradiation of a device and stability of the temperature are improved drastically. Moreover, the driver thin film transistor of the present embodiment utilizes a dual gate structure, which can supply the LED diode with large current. Therefore, VDD/VSS metal wires of the display panel of the present embodiment only need to employ metal wires of a single layer, which can decrease a number of the photomasks to prevent a risk of a short circuit.

The present invention has been described as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. An array substrate, wherein the array substrate comprises:
   an underlay;
   a source electrode disposed on the underlay;
   a drain electrode disposed on the underlay;
   a light shielding portion disposed on the underlay; and
   an active layer disposed correspondingly on the source electrode, the drain electrode, and the light shielding portion, wherein the active layer comprises a channel region;
   wherein the light shielding portion corresponds to the channel region, the source electrode, the drain electrode, and the light shielding portion are disposed in a same layer, and a material of the source electrode and the drain electrode is same as a material of the light shielding portion;
   wherein the active layer further comprises a non-channel region located on two sides of the channel region, and the source electrode and the drain electrode contact the non-channel region;

wherein the array substrate further comprises a top gate, the top gate is located on the active layer, and the top gate is disposed to correspond to the channel region of the active layer;

wherein the light shielding portion is disposed at an interval from the source electrode and is disposed at an interval from the drain electrode, and the light shielding portion is disposed opposite rightly to the top gate; or, the light shielding portion is connected to at least one of the source electrode and the drain electrode;

wherein the top gate is electrically connected to the light shielding portion through a via hole.

2. The array substrate according to claim 1, wherein the light shielding portion comprises a first portion connected to the source electrode and a second portion connected to the drain electrode, and the first portion and the second portion are spaced at an interval.

3. The array substrate according to claim 1, wherein an orthographic projection of the light shielding portion on the underlay covers an orthographic projection of a corresponding portion of the channel region of the active layer on the underlay.

4. The array substrate according to claim 1, wherein the array substrate further comprises:
a buffer layer disposed between the light shielding portion and the active layer;
a gate electrode insulation layer corresponding to the channel region and disposed between the active layer and the top gate; and
a first passivation layer disposed on the top gate;
wherein the top gate is electrically connected to the light shielding portion through a conductive layer disposed at an interval from the active layer, the conductive layer comprises a first lead wire and a second lead wire; the first lead wire and the light shielding portion are disposed in a same layer and are electrically connected to each other; the second lead wire is located on the first passivation layer, an end of the second lead wire is electrically connected to the top gate through a first via hole extending through the first passivation layer, and another end of the second lead wire is electrically connected to the first lead wire through a second via hole extending through the first passivation layer and the buffer layer.

5. The array substrate according to claim 1, wherein the top gate and/or the light shielding portion, the source electrode, the drain electrode, and the active layer constitute a thin film transistor, the array substrate comprises a driver thin film transistor and a switch thin film transistor, wherein the driver thin film transistor and the switch thin film transistor are top gate structures; or, the driver thin film transistor and the switch thin film transistor are bottom gate structures; or, the driver thin film transistor and the switch thin film transistor are dual gate structures; or, the driver thin film transistor is a dual gate structure, and the switch thin film transistor is a top gate or a bottom gate structure.

6. A display panel, comprising an array substrate and a light emitting diode (LED), wherein the array substrate comprises:
an underlay;
a source electrode disposed on the underlay;
a drain electrode disposed on the underlay;
a light shielding portion disposed on the underlay; and
an active layer disposed correspondingly on the source electrode, the drain electrode, and the light shielding portion, wherein the active layer comprises a channel region;

wherein the light shielding portion corresponds to the channel region, the source electrode, the drain electrode, and the light shielding portion are disposed in a same layer, and a material of the source electrode and the drain electrode is same as a material of the light shielding portion;

wherein the active layer further comprises a non-channel region located on two sides of the channel region, and the source electrode and the drain electrode contact the non-channel region;

wherein the array substrate further comprises a top gate, the top gate is located on the active layer, and the top gate is disposed to correspond to the channel region of the active layer;

wherein the light shielding portion is disposed at an interval from the source electrode and is disposed at an interval from the drain electrode, and the light shielding portion is disposed opposite rightly to the top gate; or, the light shielding portion is connected to at least one of the source electrode and the drain electrode;

wherein the top gate is electrically connected to the light shielding portion through a via hole.

7. The display panel according to claim 6, wherein the light shielding portion comprises a first portion connected to the source electrode and a second portion connected to the drain electrode, and the first portion and the second portion are spaced at an interval.

8. The display panel according to claim 6, wherein an orthographic projection of the light shielding portion on the underlay covers an orthographic projection of a corresponding portion of the channel region of the active layer on the underlay.

9. The display panel according to claim 6, wherein the array substrate further comprises:
a buffer layer disposed between the light shielding portion and the active layer;
a gate electrode insulation layer corresponding to the channel region and disposed between the active layer and the top gate; and
a first passivation layer disposed on the top gate;
wherein the top gate is electrically connected to the light shielding portion through a conductive layer disposed at an interval from the active layer, the conductive layer comprises a first lead wire and a second lead wire; the first lead wire and the light shielding portion are disposed in a same layer and are electrically connected to each other; the second lead wire is located on the first passivation layer, an end of the second lead wire is electrically connected to the top gate through a first via hole extending through the first passivation layer, and another end of the second lead wire is electrically connected to the first lead wire through a second via hole extending through the first passivation layer and the buffer layer.

10. The display panel according to claim 6, wherein the top gate and/or the light shielding portion, the source electrode, the drain electrode, and the active layer constitute a thin film transistor, the array substrate comprises a driver thin film transistor and a switch thin film transistor, wherein the driver thin film transistor and the switch thin film transistor are top gate structures; or, the driver thin film transistor and the switch thin film transistor are bottom gate structures; or, the driver thin film transistor and the switch thin film transistor are dual gate structures; or, the driver thin film transistor is a dual gate structure, and the switch thin film transistor is a top gate or a bottom gate structure.

11. An array substrate manufacturing method, wherein the manufacturing method comprises steps as follows:
- a step S11: forming a first metal layer on an underlay, and patterning the first metal layer to form a light shielding portion, a source electrode, and a drain electrode;
- a step S12: forming a buffer layer on the first metal layer, and patterning the buffer layer to form source and drain electrode contact holes defined through the buffer layer and corresponding to the source electrode and the drain electrode; and
- a step S13: forming an active layer on the buffer layer, and forming a channel region of the active layer and a non-channel region on two sides of the channel region;
- wherein the non-channel region of the active layer is connected to the source electrode and the drain electrode through the source and drain electrode contact holes, and the light shielding portion corresponds to the channel region.

12. The array substrate manufacturing method according to claim 11, wherein the manufacturing method further comprises a step as follow:
- a step S14: forming a gate electrode insulation layer and a top gate laminated on the active layer, wherein the gate electrode insulation layer and the top gate corresponds to the channel region located in the active layer.

* * * * *